United States Patent
Handley et al.

(10) Patent No.: US 7,551,446 B2
(45) Date of Patent: Jun. 23, 2009

(54) THERMAL MANAGEMENT DEVICE ATTACHMENT

(75) Inventors: William Handley, Chandler, AZ (US); Edoardo Campini, Mesa, AZ (US); Javier Leija, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 11/265,859

(22) Filed: Nov. 3, 2005

(65) Prior Publication Data
US 2007/0096298 A1 May 3, 2007

(51) Int. Cl.
*H05K 7/20* (2006.01)
*H01L 23/36* (2006.01)

(52) U.S. Cl. ............ 361/719; 361/707; 361/709; 165/80.3; 165/185

(58) Field of Classification Search .......... 361/687, 361/688, 702–712, 715, 719, 720–724; 165/80.2, 165/80.3, 80.4, 80.5, 104.33, 185; 257/706–727; 174/15.1, 16.3, 252
See application file for complete search history.

(56) References Cited

U.S. PATENT DOCUMENTS

| | | | |
|---|---|---|---|
| 6,519,153 B1 * | 2/2003 | Shia et al. .......... | 361/704 |
| 6,618,251 B2 * | 9/2003 | Ishimine .......... | 361/704 |
| 6,867,975 B2 * | 3/2005 | Kashiwagi .......... | 361/704 |
| 7,360,586 B2 * | 4/2008 | Mania et al. .......... | 165/185 |
| 2005/0022970 A1 * | 2/2005 | Mania et al. .......... | 165/80.3 |

OTHER PUBLICATIONS

PCI Industrial Computers: Advanced TCA. PICMG 3.0 Short Form Specification, Jan. 2003. 34 pgs.
AMC: PICMG AMC.0. Advanced Mezzanine Card Short Form Specification. Jun. 15, 2004. 58 pgs.
"Intel Pentium M Processor with 2-MB L2 Cache and 533-MHz System Bus for Embedded Applications", *Thermal Design Guide*; Feb. 2005, 39 Pages.

* cited by examiner

*Primary Examiner*—Michael V Datskovskiy
(74) *Attorney, Agent, or Firm*—Grossman, Tucker, Perreault & Pfleger, PLLC

(57) ABSTRACT

A thermal management device attachment apparatus may be used to thermally couple a thermal management device to a heat generating component on a circuit board. The attachment apparatus may include a support member mounted on the same side of the circuit board as the heat generating component and extending around at least a portion of the component. The support member may include a circuit board mounting portion, a thermal management mounting portion and a side portion extending between the circuit board mounting portion and the thermal management mounting portion. Of course, many alternatives, variations, and modifications are possible without departing from this embodiment.

6 Claims, 5 Drawing Sheets

THERMAL MANAGEMENT DEVICE ATTACHMENT

FIELD

The present disclosure relates to attaching a thermal management device to a circuit board.

BACKGROUND

Thermal management devices, such as heat sinks, have been used on circuit boards to absorb or dissipate unwanted heat generated by heat generating components, such as processors and chipsets. Developments in computer hardware have resulted in higher processing speeds and increased power requirements for circuit boards. As power requirements for circuit board components increase, larger heat sinks are needed to cool the heat generating components.

Developments in computer hardware have also resulted in space constraints, particularly in modular computer platforms such as Advanced Telecommunications Computing Architecture (AdvancedTCA), Advanced Mezzanine Card (AdvancedMC) and Compact Peripheral Component Interconnect (CompactPCI). Thus, the available volume for components on printed circuit boards in such environments is limited. The space constraints include, for example, height restrictions on the primary and secondary sides of the printed circuit boards as well as limited real estate on and within the circuit boards.

As a result of such developments, coupling heat sinks to the components on circuit boards has presented challenges. The relatively large holes used to mount the heat sink to the circuit board, for example, may interfere with the signal routing within the circuit board. The use of a back plate to secure a heat sink to a circuit board may consume valuable board space and may increase the back side height profile. The use of a back plate on the back side of a circuit board may also negatively impact performance of the component (e.g., by limiting the positioning of decoupling capacitors and traces on the circuit board).

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
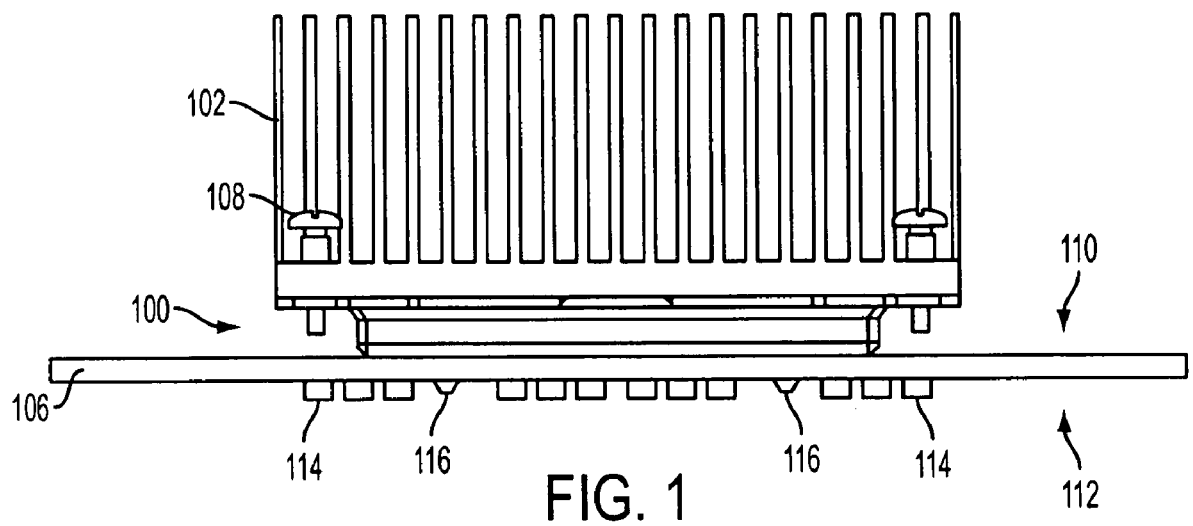
FIG. 1 is a side view of a thermal management device mounted to a circuit board using a thermal management device attachment apparatus, consistent with one embodiment of the present disclosure.
Figure 2:
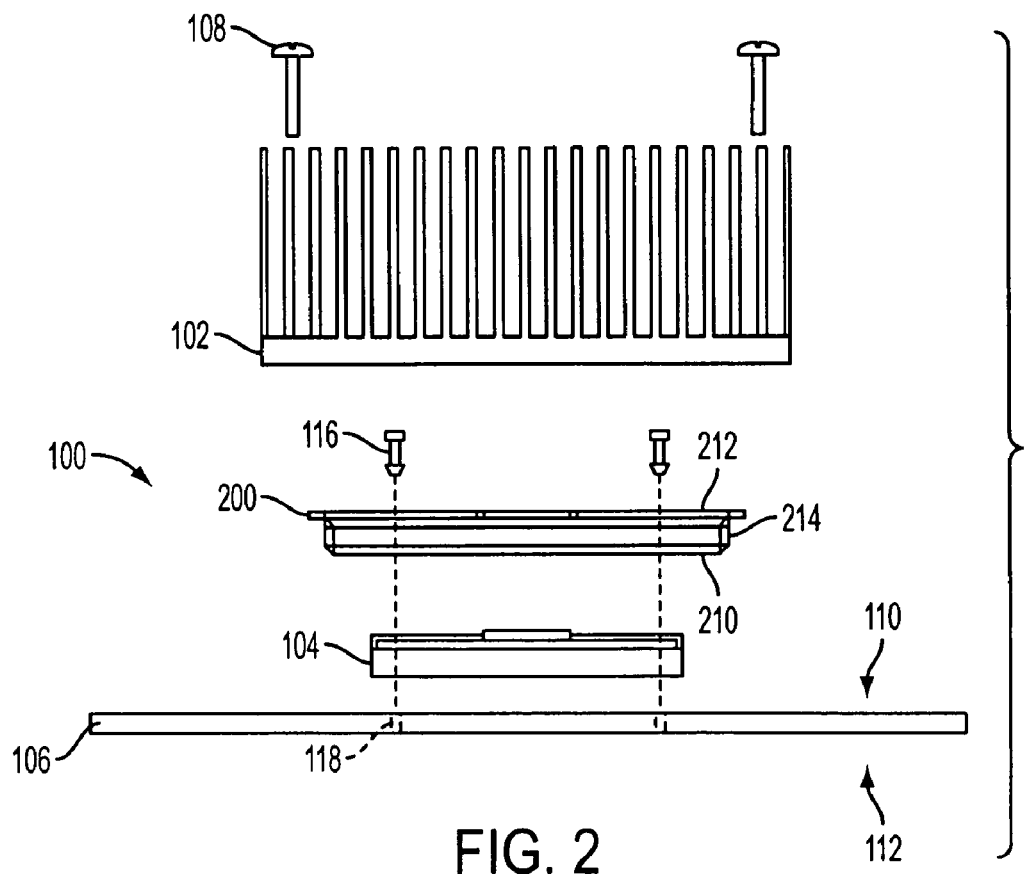
FIG. 2 is an exploded side view of the thermal management device, thermal management device attachment apparatus, circuit board and component shown in FIG. 1.
Figure 3:
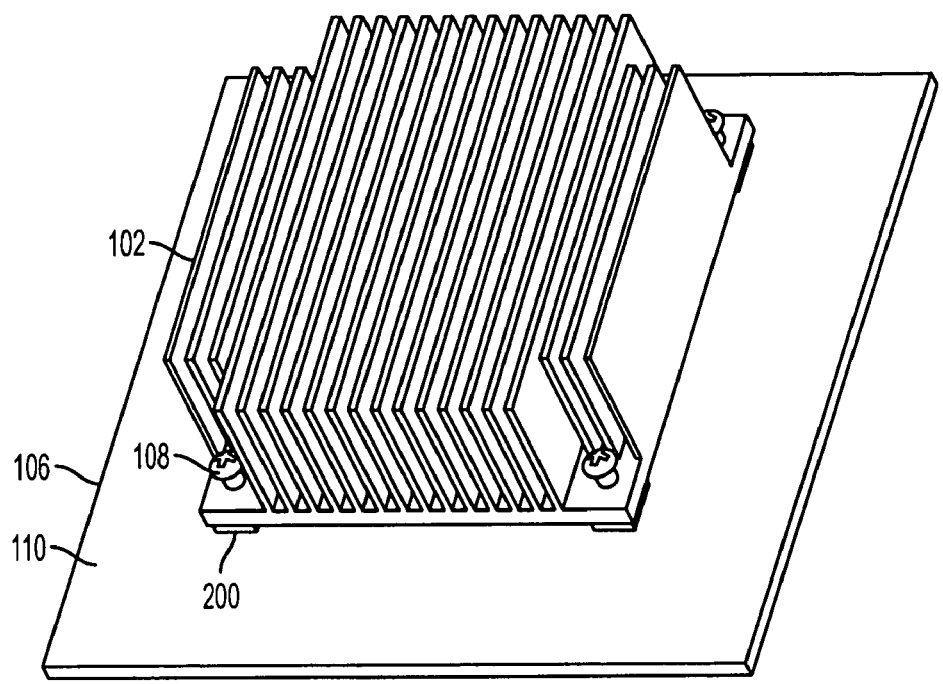
FIG. 3 is a perspective view of one embodiment of a thermal management device mounted to a circuit board using one embodiment of a thermal management device attachment apparatus.

Referring to FIGS. 1-3, a thermal management device attachment apparatus 100 may be used to thermally couple a thermal management device, such as a heat sink 102, to a heat generating component 104 on a circuit board 106. Although the exemplary embodiment is described in the context of a heat sink, a thermal management device may include any device for the transfer, absorption and/or dissipation of unwanted heat. Thermal management devices may include, but are not limited to, heat sinks, heat spreaders, heat pipes and fans.

In an exemplary embodiment, the circuit board 106 includes a first side 110 and a second side 112. One or more heat generating components 104 may be mounted to one or more sides 110, 112 of the circuit board 106 using techniques known to those skilled in the art. Heat generating components may include any circuit board components that generate heat including, but not limited to, processors and chipsets. In the illustrated embodiment, the heat generating component 104 is mounted to the first side 110 of the circuit board 106 (also referred to as the primary side). The second side 112 of the circuit board 106 (also referred to as the secondary or back side) may include circuit components 114 such as decoupling capacitors and/or traces. The circuit board 106 may also include signal routing throughout the layers of the circuit board 106.

The attachment apparatus 100 may be mounted to the first side 110 of the circuit board 106 and the heat sink 102 may be mounted to the attachment apparatus 100 such that the heat sink 102 is thermally coupled to the heat generating component 104. The heat sink 102 may be mounted to the attachment apparatus 100 using fasteners 108 known to those skilled in the art. The heat sink fasteners 108 may include any fastener capable of holding the heat sink 102 to the attachment apparatus 100 including, but not limited to bolts, screws, clips, and clamps.

Figure 4:
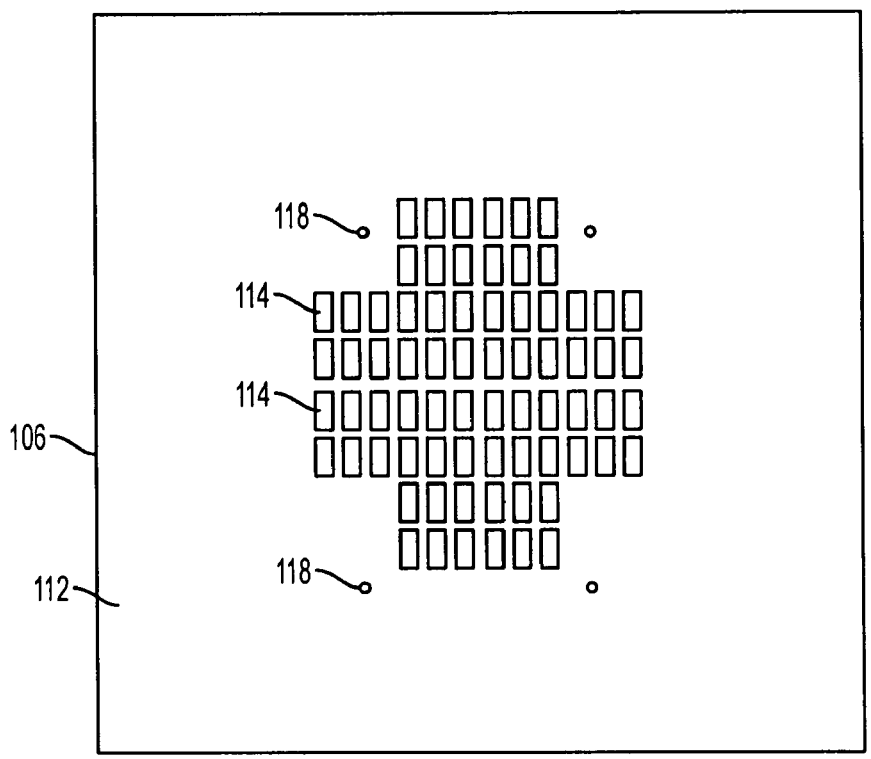
FIG. 4 is a plan view of a secondary or back side of a circuit board with a thermal management device and thermal management device attachment apparatus mounted to the primary side, consistent with one embodiment of the present disclosure.

The attachment apparatus 100 may be mounted to the circuit board 106 using one or more fasteners 116 that extend through holes 118 in the circuit board 106, as will be described in greater detail below. The holes 118 may be formed by the fasteners 116 or may be pre-formed in the circuit board 106. By mounting the attachment apparatus 100 to the first or primary side 112 of the circuit board 106 (i.e., the same side as the component 104), the attachment apparatus 100 may attach the heat sink 102 without taking up space on the back side 112 and with minimal or no interference with the positioning of the circuit components 114 on the back side 112. As shown in one example in FIG. 4, a back plate on the back side 112 of the circuit board 106 is unnecessary and thus does not interfere with positioning of circuit components 114 such as decoupling capacitors and/or signal traces (not shown). Thus, circuit components 114 such as decoupling capacitors may be placed closer to the component 104, improving performance of the component 104. The holes 118 in the circuit board also provide minimal or no interference with the circuit components 114. Thus, traces may be routed with more efficiency and signal integrity may be improved.

According to one method of assembly, the heat generating component 104 may be mounted to the first side 112 of the circuit board 106 and then the attachment apparatus 100 may be mounted to the circuit board 106 around the component 104. Alternatively, the attachment apparatus 100 may be mounted to the circuit board 106 first and the heat generating component 104 may be mounted to the circuit board 106 inside of the attachment apparatus 100. When the heat generating component 104 and the attachment apparatus 100 have been mounted, the thermal management device (e.g., the heat sink 102) may be mounted to the attachment apparatus 100 and thermally coupled to the component 104.

When mounted, the attachment apparatus 100 may extend outwardly from the circuit board 106 and around at least a portion of the heat generating component 104. In one embodiment, the attachment apparatus 100, the heat sink 102 and the circuit board 106 may enclose the heat generating component 104. The attachment apparatus 100 may extend to about the height of the heat generating component 104 such that the heat sink 102 mounted to the attachment apparatus 100 contacts the heat generating component 104 to provide thermal coupling. Alternatively, the attachment apparatus 100 may extend higher than the heat generating component 104 and the heat sink 102 may include a portion (not shown) that extends into contact with the heat generating component 104. The attachment apparatus 100 may also extend from the circuit board 106 to a lower height than the heat generating component 104, while still allowing the heat sink 102 to be mounted and thermally coupled with the component 104. According to further alternatives, other heat management devices, such has heat spreaders, heat transfer devices or materials, may be positioned between the heat sink 102 and the heat generating component 104. Although the heat sink 102 is shown as mounted directly to the attachment apparatus 100, other structures may be positioned between the heat sink 102 and the attachment apparatus 100 provided that the heat sink 102 is thermally coupled to the heat generating component 104. The attachment apparatus 100 may also be coupled to ground layers (e.g., in the circuit board 106) to provide an electromagnetic interference (EMI) cage around the component 104 to improve electrical characteristics.

Figure 5:
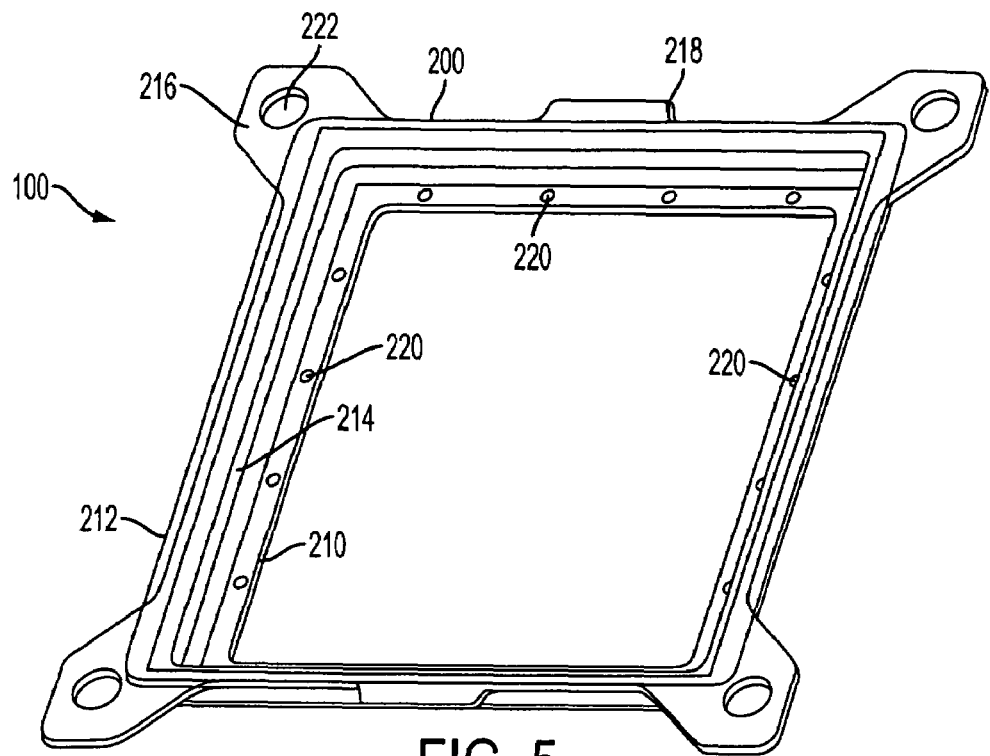
FIG. 5 is a perspective view of one embodiment of a thermal management device attachment apparatus, consistent with the present disclosure.
Figure 6:
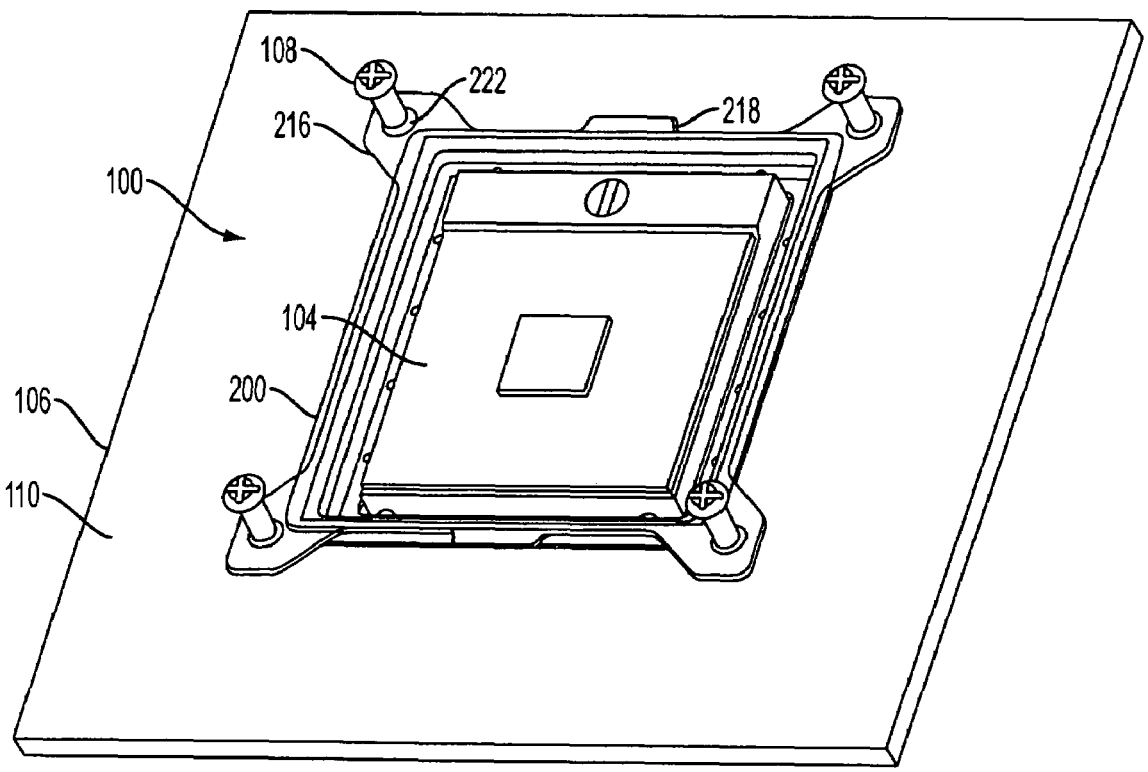
FIG. 6 is a perspective view of the thermal management device attachment apparatus shown in FIG. 5 mounted to a circuit board around a heat generating component, consistent with one embodiment of the present disclosure.

Referring to FIGS. 5 and 6, one embodiment of the attachment apparatus 100 is described in greater detail. The exemplary embodiment of the attachment apparatus 100 may include a support member 200 that extends around at least a portion of the heat generating component 104 and supports the thermal management device. The support member 200 may be made of a rigid material such as metal or reinforced polymer. One embodiment of the support member 200 may include a circuit board mounting portion 210 configured to be mounted to the circuit board 106 and a thermal management mounting portion 212 configured to be mounted to a thermal management device (e.g., the heat sink 102). The support member 200 may further include a side portion 214 extending between the circuit board mounting portion 210 and the thermal management mounting portion 212.

According to one embodiment of the support member 200, the side portion 214 may include four sides defining a generally rectangular shape corresponding to the shape of the heat generating component 104. The support member 200 may thus form a frame around the heat generating component 104 and may be sized to closely fit the size of the component 104. The height of the side portion 214 may depend on the height of the heat generating component 104 and in one example, may be in the range of about 3 mm to 6 mm. The support member 200 may also have different shapes (e.g., circular) and may extend around only a portion of the heat generating component 104 (e.g., in a U shape). The support member 200 may also be formed in multiple pieces, for example, two U-shaped halves that may be positioned around different portions of the component 104. The side portion 214 of the support member 200 may also include one or more apertures, for example, to allow air to pass through.

According to one embodiment of the support member 200, the circuit board mounting portion 210 may extend inwardly from the side portion 214 (i.e., toward the heat generating component) and the thermal management mounting portion 212 may extend outwardly from the side portion 214 (i.e., away from the heat generating component 106). In the illustrated embodiment, the circuit board mounting portion 210 is a flange extending inwardly from all sides and the thermal management mounting portion 212 is a flange extending outwardly from all sides with mounting extensions 216 at the corners. One or more tabs 218 may also extend from the thermal management mounting portion 212.

The circuit board mounting portion 210 may include circuit board mounting holes 220 configured to receive circuit board fasteners 116 (see FIGS. 1 and 2). In one embodiment, the circuit board fasteners 116 may include pin fasteners having a generally slender design, for example, a diameter or thickness of less than about 1.5 mm and more specifically about 0.5 mm or less. The use of pin fasteners allows the holes 118 (see FIG. 4) in the circuit board 106 to be smaller (e.g., having a width or diameter of less than about 1.5 mm). Smaller holes 118 in the circuit board 106 are less likely to interfere with signal routing in the circuit board 106.

Figure 7:
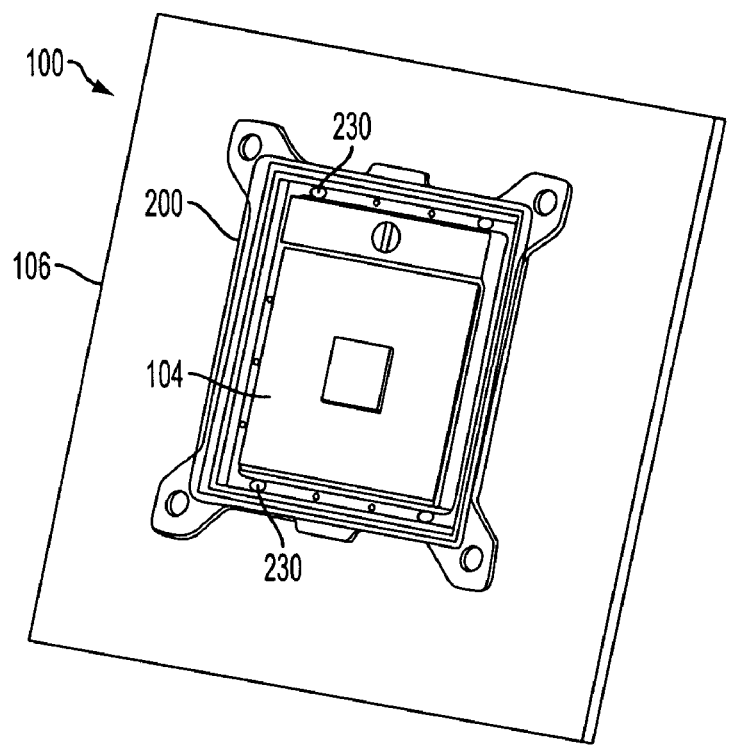
FIG. 7 is a perspective view of the thermal management device attachment apparatus shown in FIG. 5 mounted to a circuit board using solder pins, consistent with one embodiment of the present disclosure.
Figure 8:
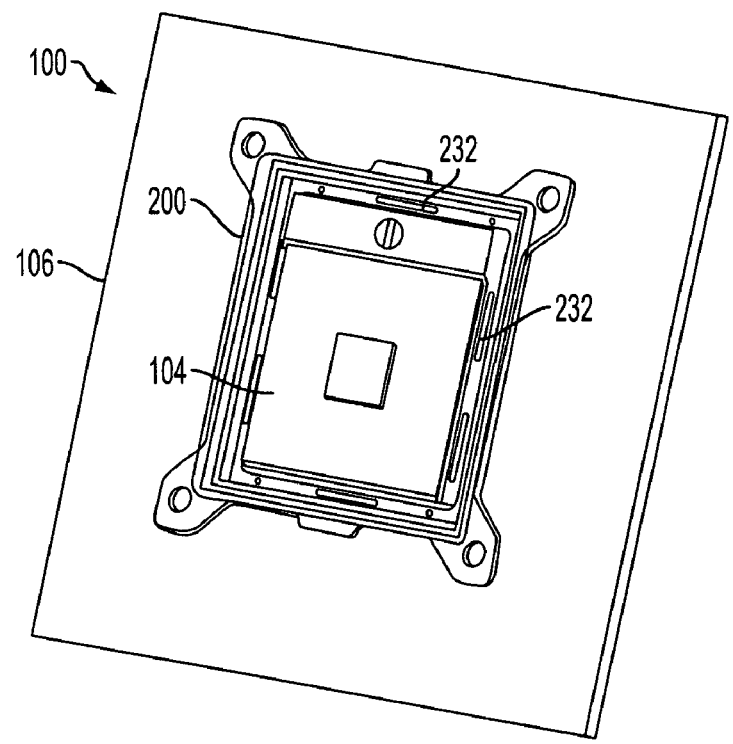
FIG. 8 is a perspective view of the thermal management device attachment apparatus shown in FIG. 5 mounted to a circuit board using staples, consistent with another embodiment of the present disclosure.

FIGS. 7 and 8 show different types of fasteners that may be used to mount the circuit board mounting portion 210 to the circuit board 106. In one embodiment shown in FIG. 7, the support member 200 is mounted to the circuit board 106 using solder pins 230 and wave soldering technologies known to those skilled in the art. Although four solder pins are shown, those skilled in the art will recognize that other numbers of solder pins may be used. In another embodiment shown in FIG. 8, the support member 200 is mounted to the circuit board 106 using staples 232. Although six staples are shown, those skilled in the art will recognize that other numbers of staples may be used. The number of fasteners may depend on the load requirements for attachment. Other examples of pin fasteners include, but are not limited to, rivets and screws. Alternatively, the support member 200 may be mounted to the circuit board 106 in other ways known to those skilled in the art, for example, using adhesive.

The thermal management mounting portion 212 may include thermal management mounting holes 222 configured to receive the heat sink fasteners 108. If the heat sink fasteners 108 include threaded fasteners, the threaded fasteners may threadably engage the thermal management mounting holes 222. Alternatively, threaded fasteners may threadably engage a nut positioned on the opposite side of the thermal management mounting portion 212.

According to alternative embodiments of the circuit board mounting portion 210, multiple flanges or sections including the circuit board mounting holes 220 may extend inwardly. According to alternative embodiments of the thermal management mounting portion 212, mounting extensions 216 may extend from the sides of the support member 200 (e.g., instead of or in addition to the corners). According to further alternative embodiments of the thermal management mounting portion 212, the mounting extensions 216 may extend outward from the side portion 214 (i.e., without a flange), or one flange including the mounting holes 222 may extend around the side portion 214 (i.e., without mounting extensions 216). Those skilled in the art will recognize that various other configurations are within the scope of the present disclosure.

Figure 9:
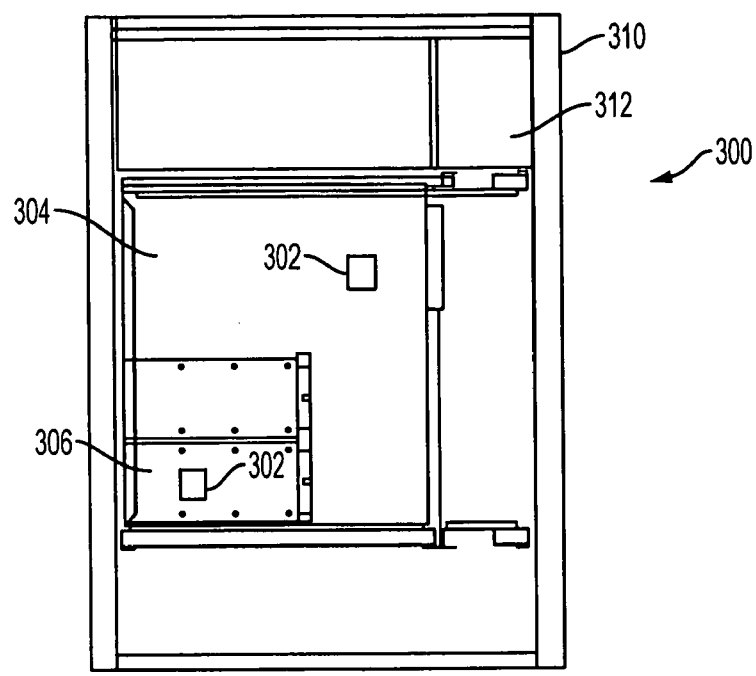
FIG. 9 is a side view of a computer system chassis including one or more circuit boards, consistent with one embodiment of the present disclosure.

Referring to FIG. 9, embodiments of the thermal management device attachment apparatus discussed above may be used in a computer system 300 to thermally couple one or more thermal management devices 302 to one or more components on one or more circuit boards 304, 306 in a chassis 310. In one embodiment, the circuit boards 304, 306 may include a carrier card 304 and one or more add-on or mezzanine cards 306 coupled to the carrier card 304. The mezzanine cards 306 may include various components and/or circuitry which may expand and/or modify the functionality of the carrier card 304. Heat generating components disposed on the circuit boards 304, 306 may include, for example, various integrated circuits such as processors and chipsets. The computer system 300 may additionally include one or more fans 312, which may facilitate cooling of the thermal management devices 302 and circuit boards 304, 306 within the chassis 310.

In an embodiment consistent with the present disclosure, the computer system 300 may be an advanced telecommunications computing architecture (Advanced TCA or ATCA) system, complying with, or compatible with, PCI Industrial Computer Manufacturers Group (PICMG), rev. 3.0, Advanced Telecommunications Computing Architecture (ATCA), published Dec. 30, 2002 (the "ATCA Specification"). According to such an embodiment, a circuit board 304 at least partially disposed within the chassis 310 may be an ATCA blade complying with and/or compatible with the ATCA Specification. Various other embodiments consistent with the present disclosure may include a computer system complying with and/or compatible with technical specifications other than and/or in addition to the ATCA Specification. The scope of the present disclosure should not, therefore, be construed as being limited to any particular computer system or form factor.

Additionally, in an embodiment consistent with the present disclosure, the add-on or mezzanine cards 306 may be advanced mezzanine card modules, complying with and/or compatible with PCI Industrial Computer Manufacturers Group (PICMG), Advanced Mezzanine Card (AdvancedMC) Base Specification, PICMG AMC.0, published Jan. 3, 2005 (the "AdvancedMC Specification"). In other embodiments herein the module or cards may comply with and/or be compatible with various technical specifications in addition to, or in the alternative to, the AdvancedMC Specification. For example the modules or cards may be PC cards, common mezzanine cards, and the like. As with the circuit board, the scope of the present disclosure should not be construed as being limited to any particular module or card form factor.

Figure 10:
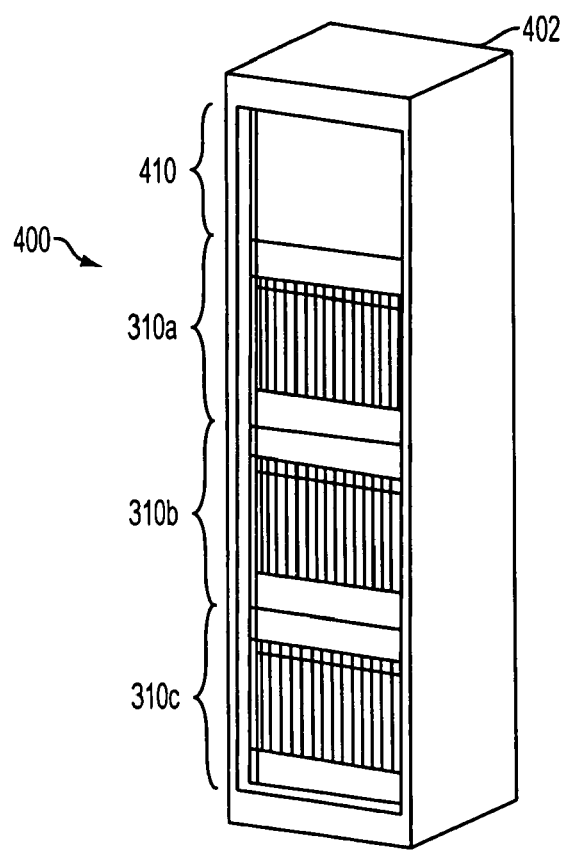
FIG. 10 is a perspective view of a system including a cabinet and a plurality of chassis, consistent with another embodiment of the present disclosure.

Referring to FIG. 10, a system 400 may include a frame or cabinet 402 that accommodates and electrically couples a plurality of chassis 310a, 310b, 310c. According to one example, a cabinet 402 may be provided by a telecommunications equipment manufacturer (TEM) to house telecommunications equipment. One or more of the chassis 310a, 310b, 310c may include at least one circuit board including a thermal management device attachment apparatus consistent with any embodiment described herein. The cabinet 402 may include, for example, a power supply for providing power to each of the individual chassis 310a, 310b, 310c and other equipment 410 (e.g., alarms, power distribution units, etc.) disposed in the cabinet 402. Additionally, as mentioned above, the cabinet 402 may electrically couple one or more of the chassis 310a, 310b, 310c to at least one other chassis.

According to an alternative embodiment, rather than being disposed in a common cabinet, a system consistent with the present disclosure may include a plurality of chassis that may be individually hardwired to one another without a cabinet. One or more of the plurality of chassis may include at least one circuit board coupled to at least one card consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Thus, one embodiment of an apparatus consistent with the present disclosure may include a circuit board including first and second sides, at least one heat generating component disposed on the first side of the circuit board, and a thermal management device support member disposed on the first side of the circuit board and extending around at least a portion of the heat generating component. The thermal management device support member may include a circuit board mounting portion mounted to the circuit board and a thermal management device mounting portion configured to be mounted to a thermal management device such that the thermal management device is thermally coupled to the heat generating component.

Consistent with another embodiment, a thermal management device attachment apparatus may include a support member including a circuit board mounting portion configured to be mounted to a circuit board, a thermal management device mounting portion configured to be mounted to a thermal management device, and a side portion extending from the circuit board mounting portion to the thermal management device mounting portion. The side portion may be configured to extend around at least a portion of a heat generating component disposed on the circuit board. The circuit board mounting portion may extend inwardly from the side portion toward the heat generating component, and the thermal management device mounting portion may extend outwardly from the side portion away from the heat generating component.

Consistent with a further embodiment, a method may include mounting a heat generating component on a first side of a circuit board and mounting a thermal management device attachment device on the first side of the circuit board. The thermal management device attachment device may include a support member including a circuit board mounting portion mounted to the circuit board, a thermal management device mounting portion configured to be mounted to a thermal management device, and a side portion extending from the circuit board mounting portion to the thermal management device mounting portion. The side portion may be configured to extend around at least a portion of the heat generating component disposed on the circuit board.

Consistent with yet another embodiment, a system may include a cabinet comprising a plurality of chassis, at least one of the chassis being an Advanced Telecommunications Computing Architecture chassis. A circuit board including first and second sides may be disposed in at least one of the chassis. At least one heat generating component may be disposed on the first side of the circuit board. A thermal management device support member may be disposed on the first side of the circuit board and may extend around at least a portion of the heat generating component. The thermal management device support member may include a circuit board mounting portion mounted to the circuit board and a thermal management device mounting portion configured to be mounted to a thermal management device such that the thermal management device is thermally coupled to the heat generating component.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A thermal management device attachment apparatus comprising:
   a support member comprising:
      a circuit board mounting portion configured to be mounted to a circuit board, said circuit board mounting portion includes a plurality of mounting holes each having a width less than 1.5 mm;
      a thermal management device mounting portion configured to be mounted to a thermal management device, said thermal management device comprising mounting extensions extending from corners of said support member, said mounting extensions including mounting holes for receiving thermal management device fasteners; and
      a side portion extending from said circuit board mounting portion to said thermal management device mounting portion, said side portion being configured to extend around at least a portion of a heat generating component disposed on said circuit board, and wherein said circuit board mounting portion extends inwardly from said side portion toward said heat generating component, and wherein said thermal management device mounting portion extends outwardly from said side portion away from said heat generating component;
   a plurality of fasteners configured to extend through said plurality of mounting holes in said circuit board mounting portion and into said circuit board, said fasteners having a thickness less than 1.5 mm, wherein said side portion of said support member includes four sides that form a shape corresponding to a shape of said heat generating component.

2. The thermal management device attachment apparatus of claim 1 further comprising pin fasteners configured to extend through said circuit board mounting portion into said circuit board.

3. The thermal management device attachment apparatus of claim 2 wherein said pin fasteners include solder pins.

4. The thermal management device attachment apparatus of claim 2 wherein said pin fasteners include staples.

5. The thermal management device attachment apparatus of claim 1 further comprising thermal management device fasteners configured to attach said thermal management device to said thermal management device mounting portion.

6. The thermal management device attachment apparatus of claim 1 wherein said side portion of said support member is rectangular shaped.

* * * * *